United States Patent
Hashimoto

(10) Patent No.: US 12,167,539 B2
(45) Date of Patent: Dec. 10, 2024

(54) TAPE FEEDER

(71) Applicant: FUJI CORPORATION, Chiryu (JP)

(72) Inventor: Hideki Hashimoto, Miyoshi (JP)

(73) Assignee: FUJI CORPORATION, Chiryu (JP)

( * ) Notice: Subject to any disclaimer, the term of this patent is extended or adjusted under 35 U.S.C. 154(b) by 406 days.

(21) Appl. No.: 17/633,119

(22) PCT Filed: Aug. 6, 2019

(86) PCT No.: PCT/JP2019/030805
§ 371 (c)(1),
(2) Date: Feb. 4, 2022

(87) PCT Pub. No.: WO2021/024365
PCT Pub. Date: Feb. 11, 2021

(65) Prior Publication Data
US 2022/0295679 A1    Sep. 15, 2022

(51) Int. Cl.
*H05K 13/04* (2006.01)
*H05K 13/02* (2006.01)

(52) U.S. Cl.
CPC ......... *H05K 13/0473* (2013.01); *H05K 13/02* (2013.01)

(58) Field of Classification Search
CPC .... H05K 13/02; H05K 13/023; H05K 13/029; H05K 13/0419; H05K 13/0421; H05K 13/0426; H05K 13/081; H05K 13/086; Y10T 29/49139; Y10T 29/49135; Y10T 29/4914; Y10T 29/53174; Y10T 29/53183
See application file for complete search history.

(56) References Cited

U.S. PATENT DOCUMENTS

2019/0133007 A1 *    5/2019    Watanabe ............ H05K 13/029

FOREIGN PATENT DOCUMENTS

| JP | 2001-53493 A | 2/2001 | |
|---|---|---|---|
| JP | 2015-37084 A | 2/2015 | |
| JP | 2017-34170 A | 2/2017 | |
| KR | 20180027681 A * | 3/2018 | |
| WO | WO 2017/029726 A1 | 2/2017 | |
| WO | WO-2017017730 A1 * | 2/2017 | ............. H05K 13/02 |

OTHER PUBLICATIONS

KR 2018-0027681 translation from FIT database (Year: 2024).*
WO 2017-017730 translation from FIT database (Year: 2024).*
International Search Report mailed on Nov. 5, 2019 in PCT/JP2019/030805 filed on Aug. 6, 2019, 1 page.

* cited by examiner

*Primary Examiner* — Jeffrey T Carley
*Assistant Examiner* — Joshua D Anderson
(74) *Attorney, Agent, or Firm* — Oblon, McClelland, Maier & Neustadt, L.L.P.

(57) ABSTRACT

There is provided a tape feeder for supplying, using a taped electric component including a carrier tape and multiple electric components held onto the carrier tape, the electric component in a supply position, the tape feeder including a detection sensor configured to detect presence or absence of the electric component in the supply position.

5 Claims, 18 Drawing Sheets

TAPE FEEDER

TECHNICAL FIELD

The present application relates to a tape feeder for supplying an electric component in a supply position using a taped electric component including a carrier tape and multiple electric components held onto the carrier tape.

BACKGROUND ART

The following Patent Literature describes a tape feeder for supplying an electric component in a supply position using a taped electrical component.

PATENT LITERATURE

Patent Literature 1: International Publication No. WO2017/029726

BRIEF SUMMARY

Technical Problem

A technical problem to be solved by the present description is how to suitably supply an electric component in a supply position using a taped electric component.

Solution to Problem

In order to solve the technical problem described above, according to the present description, there is disclosed a tape feeder for supplying, using a taped electric component including a carrier tape and multiple electric components held onto the carrier tape, the electric component in a supply position, the tape feeder including a detection sensor configured to detect presence or absence of the electric component in the supply position.

Advantageous Effects

According to the present disclosure, the presence or absence of the electric component in the supply position is detected by the detection sensor. As a result, the electric component can suitably be supplied in the supply position using the taped electric component.

DESCRIPTION OF EMBODIMENTS

Hereinafter, referring to drawings, an embodiment of the present disclosure will be described as a mode for carrying out the present disclosure.

Figure 1:
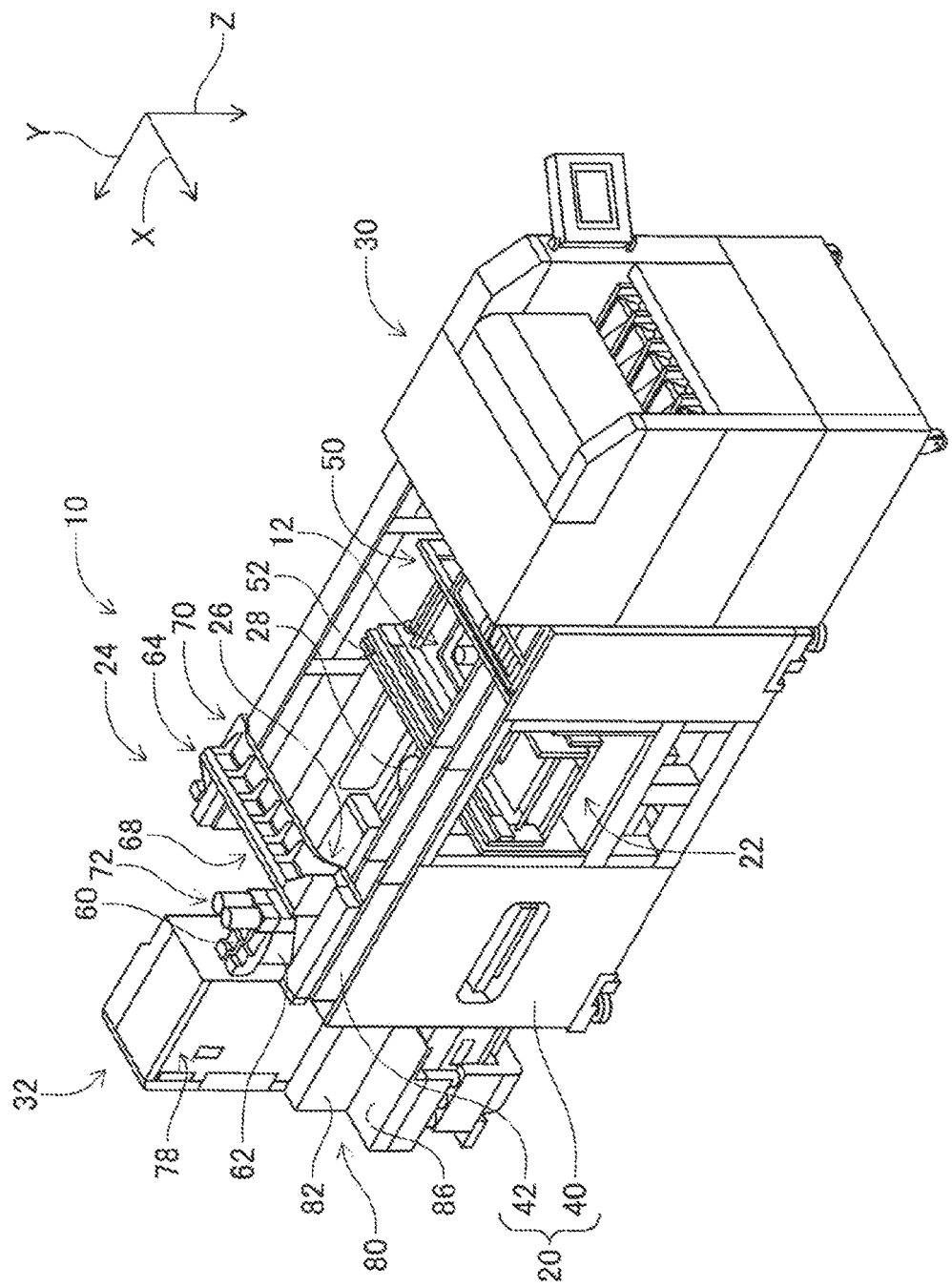
FIG. 1 is a perspective view showing a component mounter.

FIG. 1 shows component mounter 10. Component mounter 10 is a device for performing mounting work of a component on circuit base material 12. Component mounter 10 includes device main body 20, base material conveyance and holding device 22, component mounting device 24, imaging devices 26, 28, bulk component supply device 30, and component supply device 32. Examples of circuit base material 12 include a circuit board, a base material having a three-dimensional structure, and the like, and examples of such a circuit board include a printed wiring board, a printed circuit board, and the like.

Device main body 20 is made up of frame 40 and beam 42 placed on frame 40. Base material conveyance and holding device 22 is provided at a longitudinal center of frame 40 and has conveyance device 50 and clamp device 52. Conveyance device 50 is a device for conveying circuit base material 12, and clamp device 52 is a device for holding circuit base material 12. As a result, conveyance and holding device 22 conveys circuit base material 12 and fixedly holds circuit base material 12 in a predetermined position. In the following description, a conveyance direction in which circuit base material 12 is conveyed is referred to as an X-direction, a horizontal direction perpendicular to that direction is referred to as a Y-direction, and a vertical direction is referred to as a Z-direction. That is, a widthwise direction of component mounter 10 is the X-direction, and a front-rear direction is the Y-direction.

Figure 2:
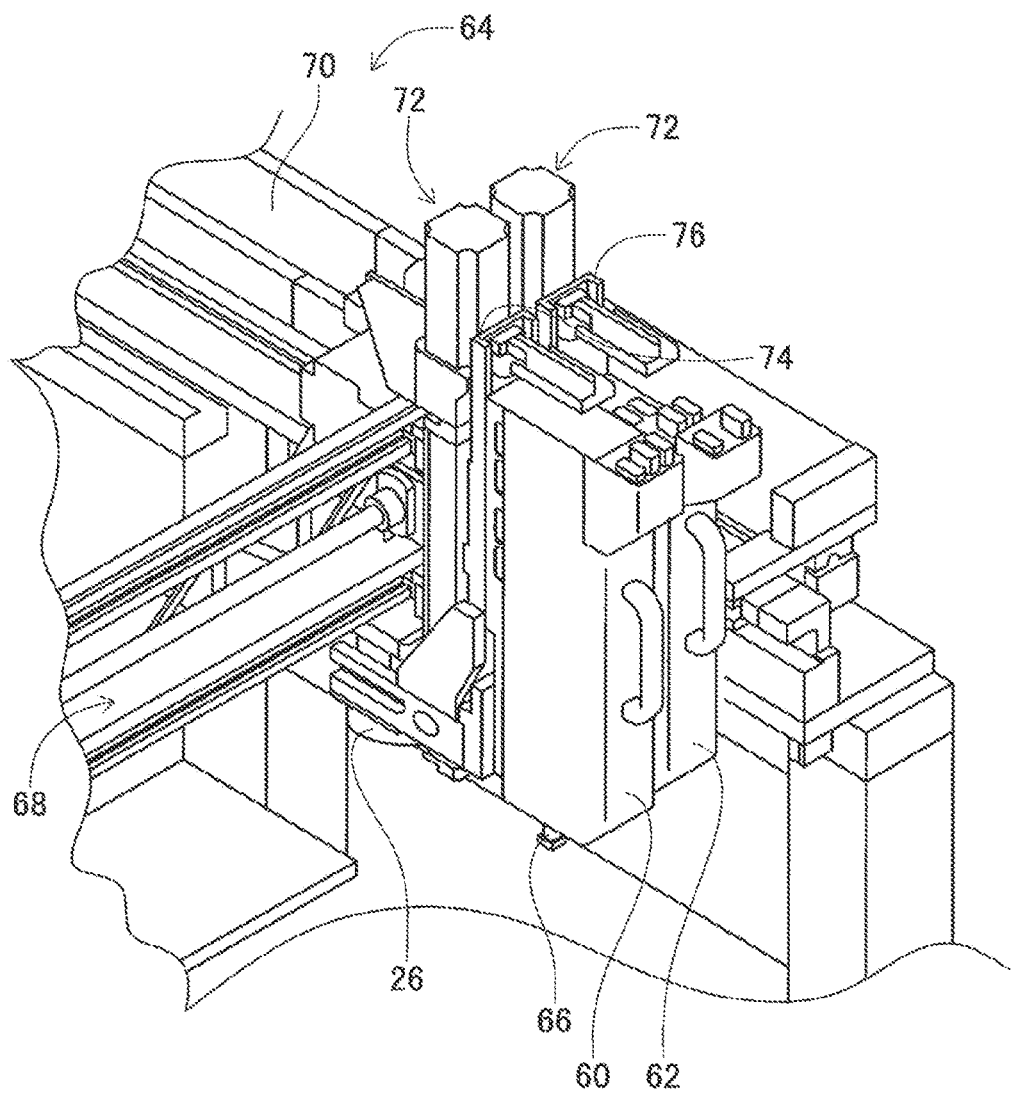
FIG. 2 is a perspective view showing a component mounting device of the component mounter.

Component mounting device 24 is disposed on beam 42 and includes two work heads 60, 62 and work head moving device 64. As shown in FIG. 2, suction nozzle 66 is detachably provided at a lower end face of each of work heads 60, 62, so that components are held by suction nozzles 66. In addition, work head moving device 64 has X-direction moving device 68, Y-direction moving device 70, and Z-direction moving devices 72. Then, two work heads 60, 62 are moved together to an arbitrary position on frame 40 by X-direction moving device 68 and Y-direction moving device 70. In addition, work heads 60, 62 are detachably mounted on sliders 74, 76, respectively, and Z-direction moving devices 72 individually and separately move those sliders 74, 76 in an up-down direction. That is, work heads 60, 62 are individually and separately moved in the up-down direction by corresponding Z-direction moving devices 72.

Imaging device 26 is attached to slider 74 while being directed downwards and is moved together with work head 60 in the X-direction, Y-direction, and Z-direction. As a result, imaging device 26 images an arbitrary position on frame 40. As shown in FIG. 1, imaging device 28 is provided while being directed upwards between base material conveyance and holding device 22 and component supply device 32 on frame 40. As a result, imaging device 28 images components held onto suction nozzles 66 of work heads 60, 62.

Bulk component supply device 30 is provided at a first end portion of frame 40 in the front-rear direction. Bulk component supply device 30 is a device for aligning multiple components that are scattered individually and supplying the components in an aligned state. That is, bulk component supply device 30 is the device for aligning multiple components in arbitrary states into a predetermined orientation and supplying the components in the predetermined orientation.

Component supply device 32 is provided at a second end portion of frame 40 in the front-rear direction. Component supply device 32 includes tray-type component supply device 78 and feeder-type component supply device 80. Tray-type component supply device 78 is a device for supplying components that are placed on a tray. Feeder-type component supply device 80 is a device for supplying components by tape feeder 82. Tape feeder 82 will be described in detail below. Examples of components that are supplied by bulk component supply device 30 and component supply device 32 include electronic circuit components, constituent components of a solar cell, constituent components of a power module, and the like. Additionally, electronic circuit components include a component with leads, a component without leads, and the like.

Tape feeder 82 is detachably mounted on tape feeder holding stand 86 that is fixedly provided at the second end portion of frame 40. Tape feeder 82 is a taped lead component supply device for removing axial components from taped component (refer to FIG. 3) 88 and supplying the axial components so removed to work heads 60, 62 of component mounter 10 in such a state that lead wires of the removed components are bent.

Figure 3:
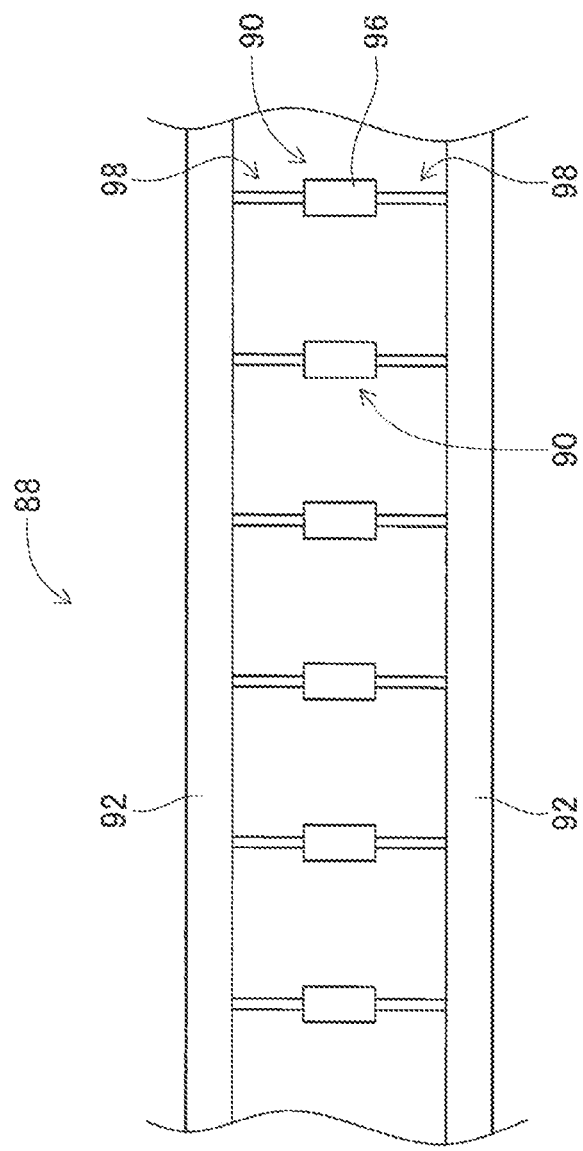
FIG. 3 is a plan view showing a taped component.

As shown in FIG. 3, taped component 88 is made up of multiple axial components 90 and two carrier tapes 92. Axial component 90 includes generally cylindrical component main body 96 and two lead wires 98. Two lead wires 98 each have a generally straight-line shape and are individually fixed to corresponding end faces of component main body 96 in such a manner as to be coaxial with an axial center of component main body 96. Then, axial component 90 is taped to two carrier tapes 92 at distal ends of two lead wires 98, that is, at ends thereof which lie opposite to component main body 96 in such a state that axial component 90 is held by two carrier tapes 92 therebetween. Multiple axial components 90 are taped to two carrier tapes 92 at equal intervals or pitches.

Figure 4:
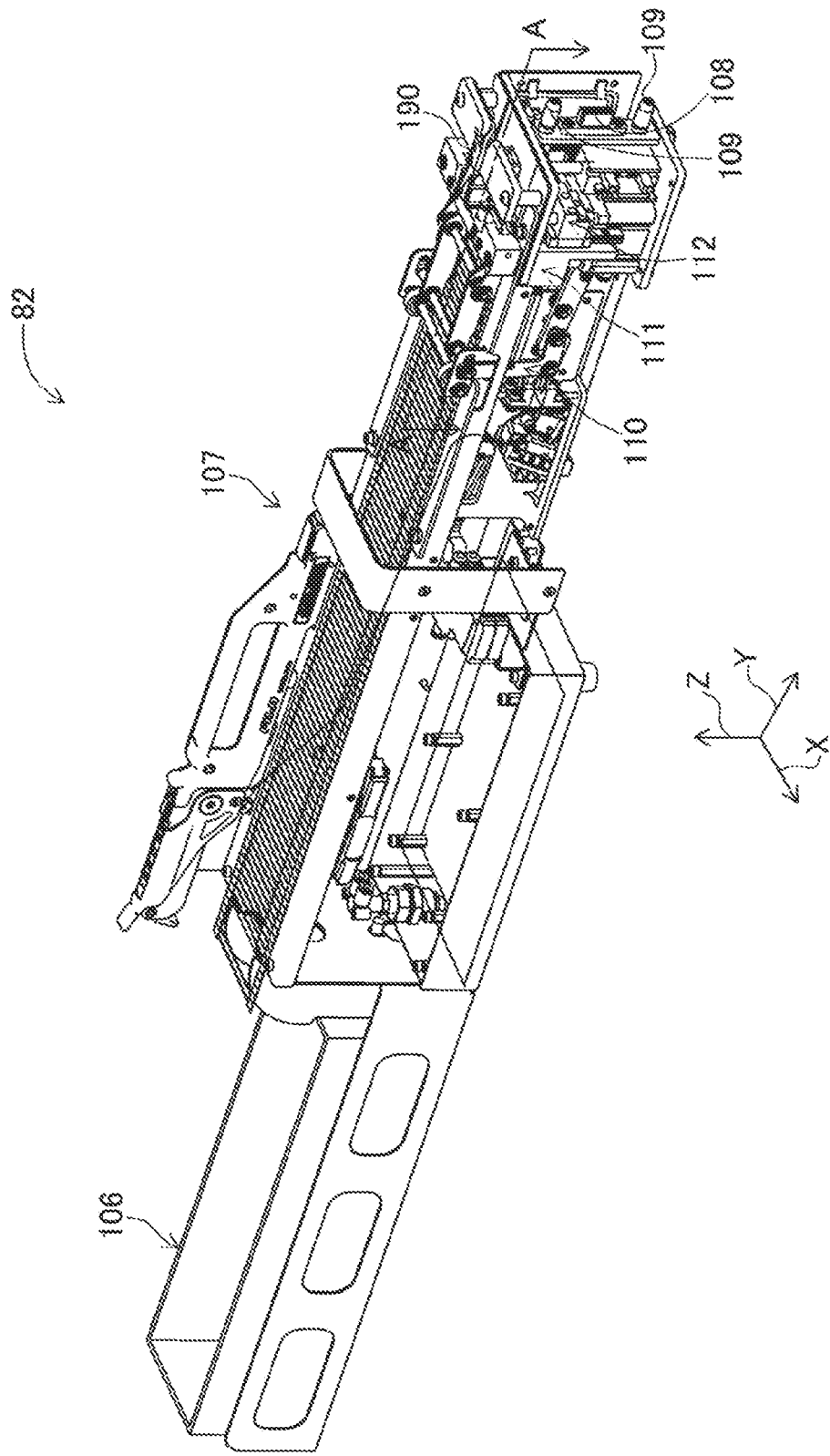
FIG. 4 is a perspective view of a tape feeder.

As shown in FIG. 4, tape feeder 82 is made up of accommodation box 106 and feeder main body 107. In the following description, a direction from accommodation box 106 to feeder main body 107 is referred to as front or forward, while a direction from feeder main body 107 to accommodation box 106 is referred to as rear or rearward. Connector 108 and two pins 109 are provided on a front end face of feeder main body 107. Then, when tape feeder 82 is attached to tape feeder holding stand 86, connector 108 is connected to a connector connection section (not shown) that is formed in tape feeder holding stand 86 whereby electric power is supplied, and pins 109 are fitted in pin holes (not shown) that are formed in tape feeder holding stand 86 whereby tape feeder 82 is positioned accurately. In addition, taped component 88 is accommodated in accommodation box 106 in a folded state. Then, taped component 88, which is accommodated in accommodation box 106, is pulled out, so that taped component 88 so pulled out is allowed to extend over an upper end face of feeder main body 107.

Figure 5:
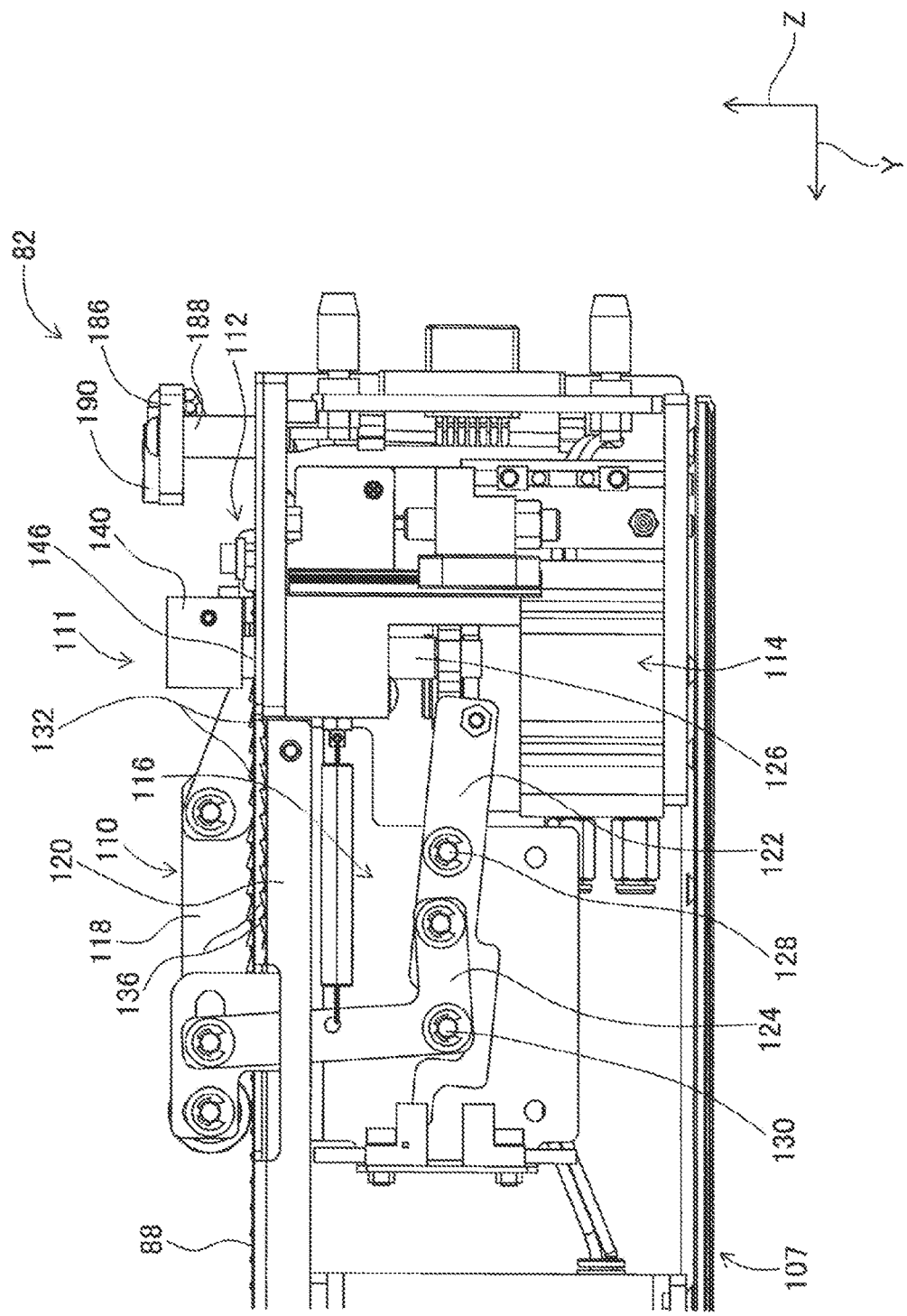
FIG. 5 is an enlarged side view of the tape feeder.

Feeding device 110, cutting device 111, and bending device 112 are disposed inside feeder body 107. As shown in FIG. 5, feeding device 110 includes piston 114, link mechanism 116, feed arm 118, and reversal prevention arm 120. Piston 114 is disposed at a lower portion inside feeder main body 107 in such a manner as to extend generally in the up-down direction. Link mechanism 116 is made up of first arm 122 having generally a rod-like shape and second arm 124 having generally an L-like shape. First arm 122 is disposed in such a manner as to extend in the front-rear direction inside feeder main body 107 and is coupled to piston rod 126 of piston 114 at a front end thereof. Then, first arm 122 is pivotally supported by support shaft 128 at a central portion thereof in the front-rear direction.

In addition, second arm 124, which has generally the L-like shape, is disposed inside feeder main body 107 in such a state that a first end extends upwards from the upper end face of feeder main body 107, while a second end extends to the front. Then, second arm 124 is coupled to a rear end of first arm 122 at the second end which extends towards the front. Second arm 124 is pivotally supported by support shaft 130 in a position lying further rearwards than a coupling portion where second arm 124 is coupled to first arm 122.

Figure 6:
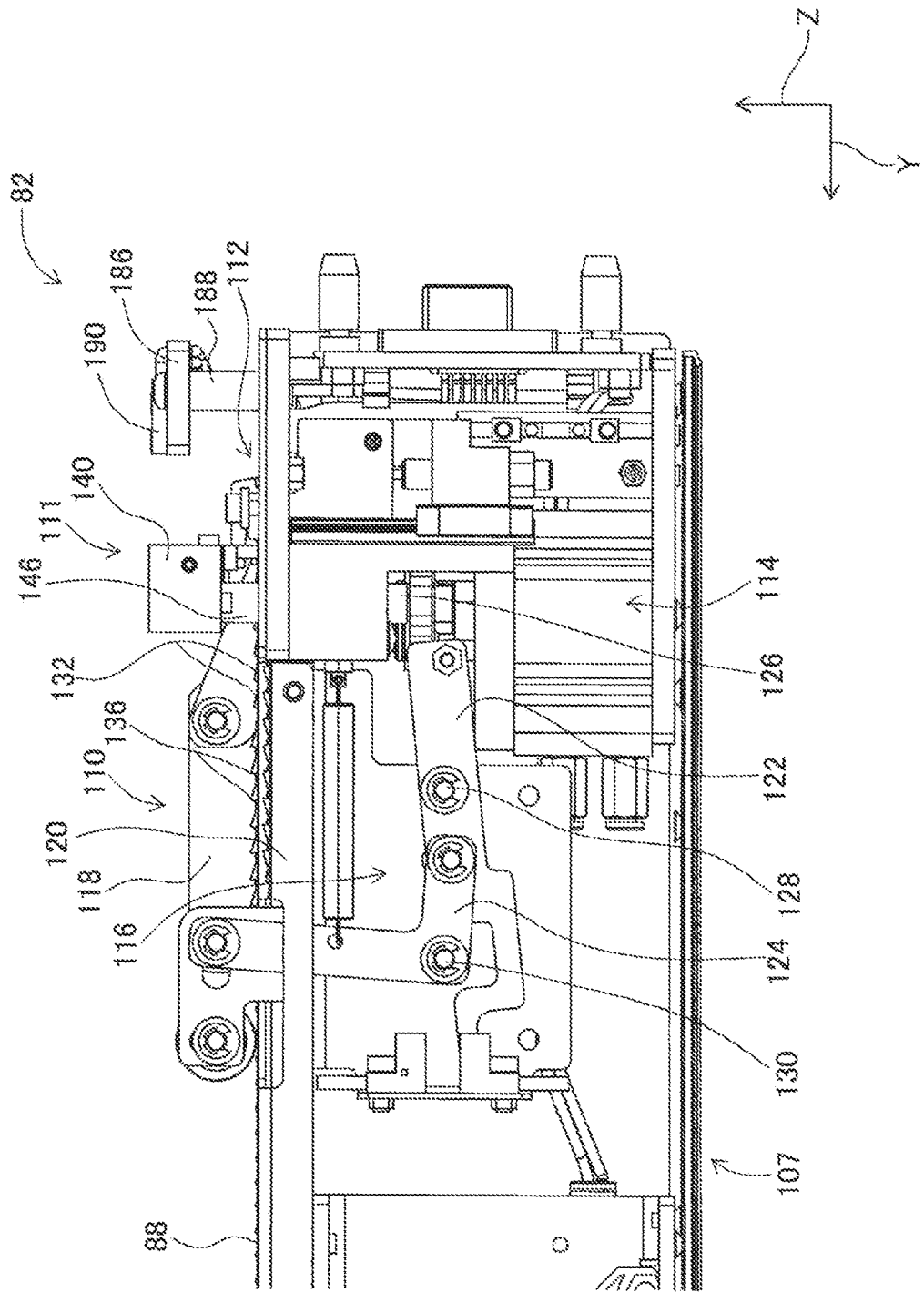
FIG. 6 is the same enlarged side view of the tape feeder.

With this structure, when piston 114 extends, that is, when piston rod 126 extends upwards, as shown in FIG. 6, the front end of first arm 122 also ascends, while the rear end of first arm 122 descends. As a result, the second or front end of second arm 124 also descends, and the first or upper end of second arm 124, which extends upwards from the upper end face of feeder main body 107, moves towards the front. On the other hand, when piston 114 contracts, that is, when piston rod 126 descends toward an inside of piston 114, as shown in FIG. 5, the front end of first arm 122 also descends, whereby the rear end of first arm 122 ascends. As a result, the front end of second arm 124 also ascends, and the upper end of second arm 124, which extends from the upper end face of feeder main body 107, moves towards the rear.

Feed arm 118 is coupled to the upper end of second arm 124 which extends upwards from the upper end face of feeder main body 107. Feed arm 118 is disposed in such a manner as to extend in the front-rear direction on an upper surface of taped component 88, which is disposed in such a manner as to extend on the upper end face of feeder main body 107, and is coupled to the upper end of second arm 124 at a rear end thereof. Multiple feed teeth 132, each having a serrated edge, are formed on a lower edge of feed arm 118. Then, those multiple feed teeth 132 are in engagement with lead wires 98 of axial components 90 of taped component 88, which extends on the upper end face of feeder main body 107. Intervals or pitched at which multiple feed teeth 132 are formed are identical to intervals or pitches at which axial components 90 are disposed in taped component 88 (lead installation pitches at which leads of axial components 90 are adhesively secured to carrier tapes 92). The serrated edges of feed teeth 132 of feed arm 118 are formed so as not only to enable taped component 88 to be stably fed out towards the front of tape feeder 82 but also not to interrupt a return operation of feed arm 118 when feed arm 118 returns, which would otherwise be interrupted as a result of the lower edges of feed teeth 132 being caught by lead wires 98 of axial components 90 which are adhesively secured to carrier tapes 92. Specifically speaking, the serrated edges of feed tooth 132 are each made up of two surfaces which extend downwards, and inclination angles of the two surfaces are different from each other. Of those two surfaces, a surface whose inclination angle is larger faces the front, and the lead wires 98 of axial component 90 are fed out towards the front by the surface of the larger inclination angle. On the other hand, of the two surfaces, a surface whose inclination angle is smaller faces to the rear, so that the surface of the smaller inclination angle is hardly caught by lead wires 98 during a return operation of feed arm 118. As a result, as shown in FIG. 6, when the upper end of second arm 124 moves towards the front as piston 114 extends, feed arm 118 is also caused to move towards the front, whereby taped component 88 is fed out towards the front of tape feeder 82.

Additionally, reversal prevention arm 120 is disposed below taped component 88, which extends on the upper end face of feeder main body 107. That is, reversal prevention arm 120 is disposed in such a state that reversal prevention arm 120 faces feed arm 118 while holding taped component 88, which extends on the upper end face of feeder main body 107, therebetween. Teeth 136 are formed on an upper edge of reversal prevention arm 120. Teeth 136 of reversal prevention arm 120 each have a blade shape, which is formed so as to prevent taped component 88 from being interrupted as a result of teeth 136 being caught by lead wires 98 on taped component 88 when taped component 88 is fed to the front by feed arm 118. Specifically speaking, the blade shape of each of teeth 136 of reversal prevention arm 120 is formed by two surfaces, which extend upwards, and inclination angles of the two surfaces are different from each other. Of the two surfaces, a surface whose inclination angle is smaller faces the rear, and this surface of the smaller inclination angle is hardly caught by lead wires 98 on taped component 88 when taped component 88 is fed to the front by feed arm 118. On the other hand, of the two surfaces, a surface whose inclination angle is larger faces the front, and this surface of the larger inclination angle is brought into engagement with lead wires 98 of axial component 90 on taped component 88 from the rear when feed arm 118 performs a return operation. As a result, a rearward movement of taped component 88, that is, a reversal of taped component 88 to the rear is prevented when feed arm 118 performs a return operation.

Figure 7:
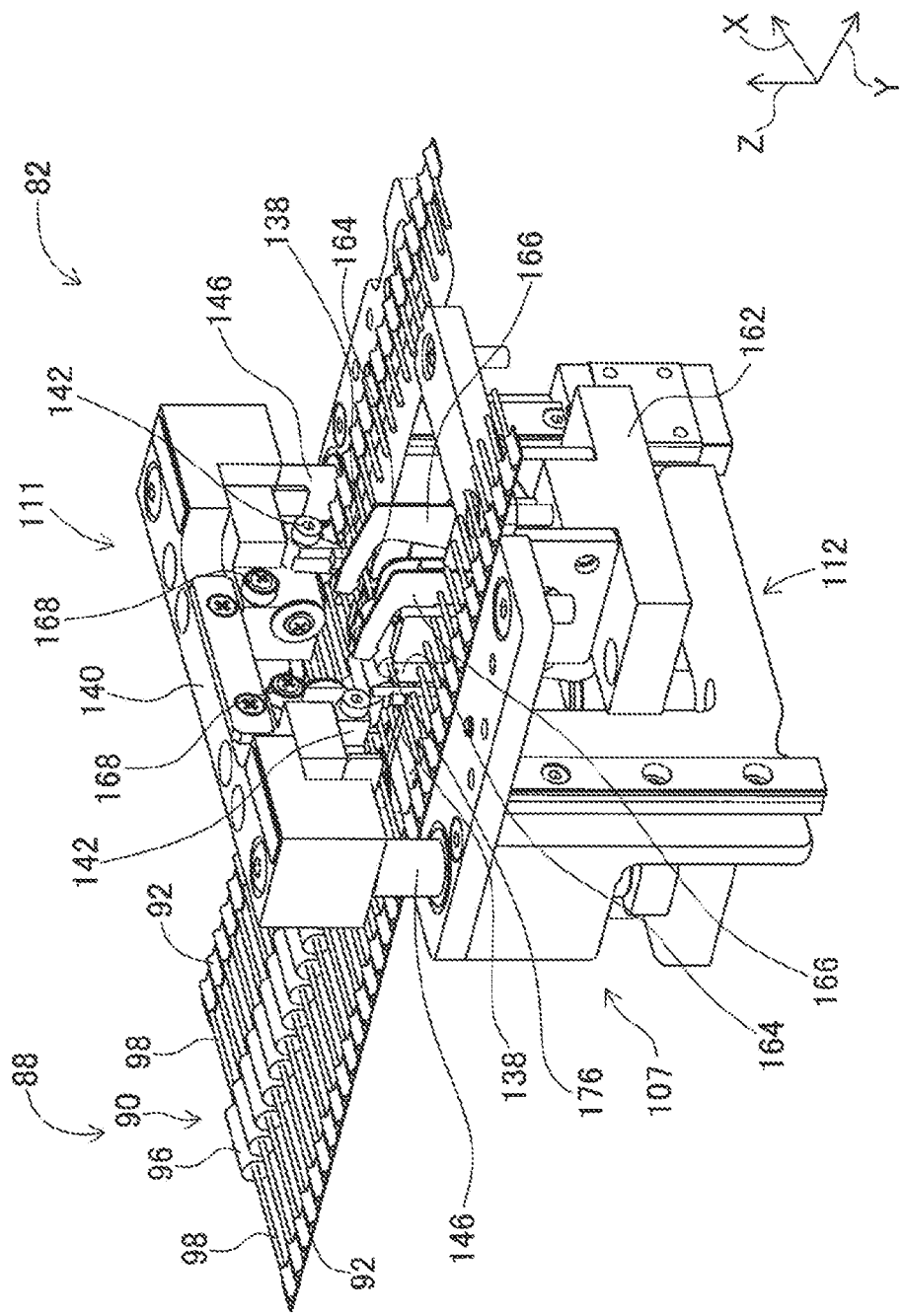
FIG. 7 is an enlarged perspective view showing a cutting device and a bending device.

As shown in FIG. 7, pair of stoppers 138 are erected on a front side of tape feeder 82, towards which taped component 88 is fed out by feed arm 118, in such a manner as to extend upwards between two carrier tapes 92 of taped component 88, which extends on the upper end face or upper surface of feeder main body 107. Pair of stoppers 138 are erected in positions which face pair of lead wires 98 on taped component 88, which extends on the upper surface of feeder main body 107. As a result, pair of lead wires 98 of axial component 90, which are taped to taped component 88, are brought into abutment with pair of stoppers 138 when taped component 88 is fed out by feed arm 118, whereby that axial component 90 is positioned. FIG. 7 is a perspective view showing a front end of tape feeder 82 as viewed obliquely from above; however, in FIG. 7, feeding device 110 and feeder main body 107 are omitted from illustration.

Figure 8:
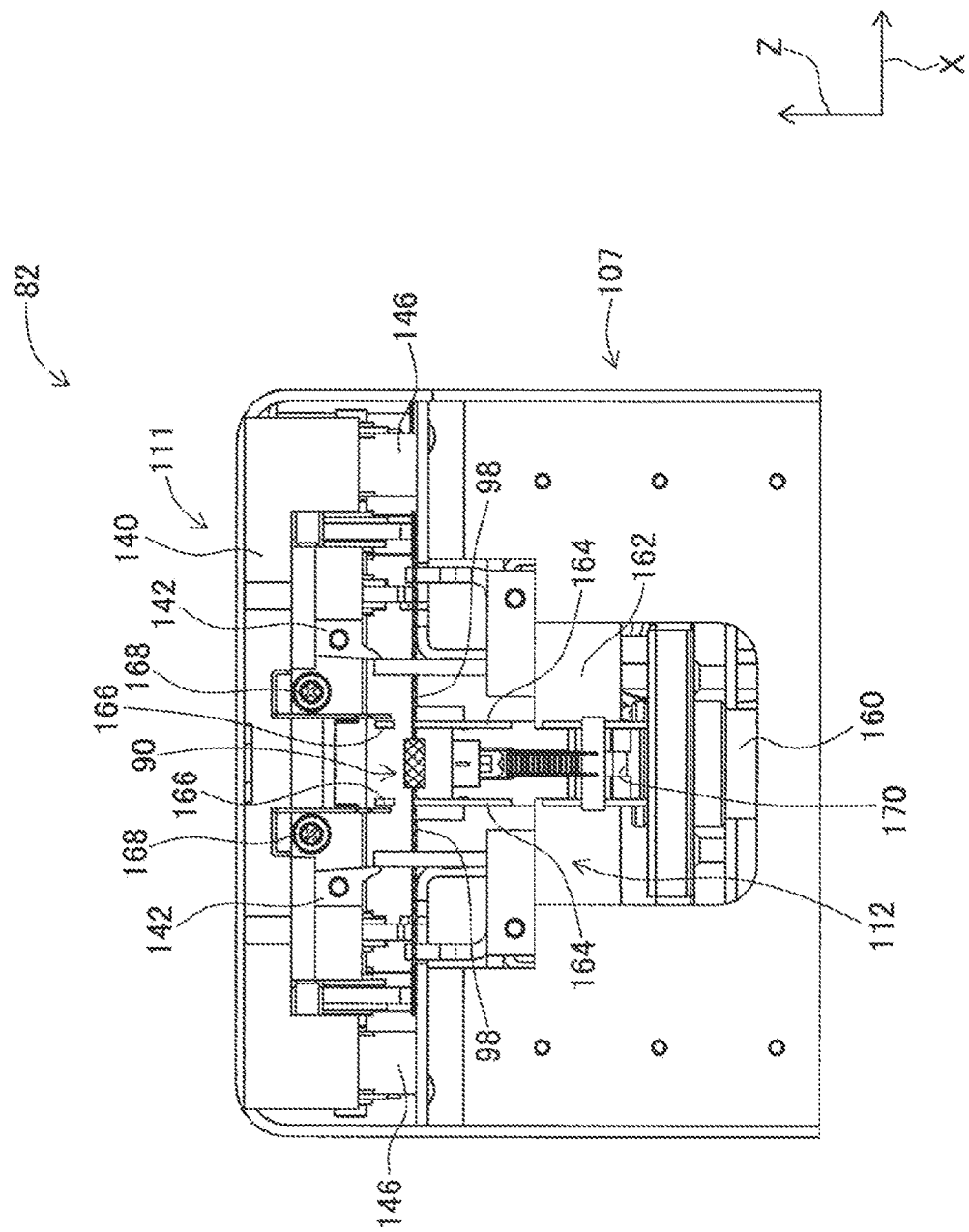
FIG. 8 is an enlarged front view of the tape feeder.

In addition, as shown in FIGS. 5 to 8, cutting device 111 is made up of lifting and lowering block 140 and pair of cutters 142. FIG. 8 is a diagram showing cutting device 111 as viewed from the front. Lifting and lowering block 140 is supported by feeder main body 107 in such a manner as to be lifted up and lowered above taped component 88, which extends on the upper surface of feeder main body 107. Lifting and lowering block 140 is located above axial component 90 that is positioned by stoppers 138 of taped component 88, which extends on the upper surface of feeder main body 107. Additionally, lifting and lowering block 140 is coupled to piston rod 126 of piston 114 via support arms 146. As a result, lifting and lowering block 140 ascends as piston 114 extends, whereas lifting and lowering block 140 descends as piston 114 contracts.

In addition, pair of cutters 142 of cutting device 111 are detachably fixed to a lower surface of lifting and lowering block 140 while being positioned in such a state that cutting edges thereof are directed downwards. The cutting edge of a first cutter 142 of pair of cutters 142 faces a first lead wire 98 of pair of lead wires 98 of axial component 90 which are positioned by corresponding stoppers 138 in such a state that lifting and lowering block 140 is lifted up. In addition, the cutting edge of a second cutter 142 of pair of cutters 142 faces a second lead wire 98 of pair of lead wires 98 of axial component 90 which are positioned by corresponding stoppers 138 in such a state that lifting and lowering block 140 is lifted up.

Figure 9:
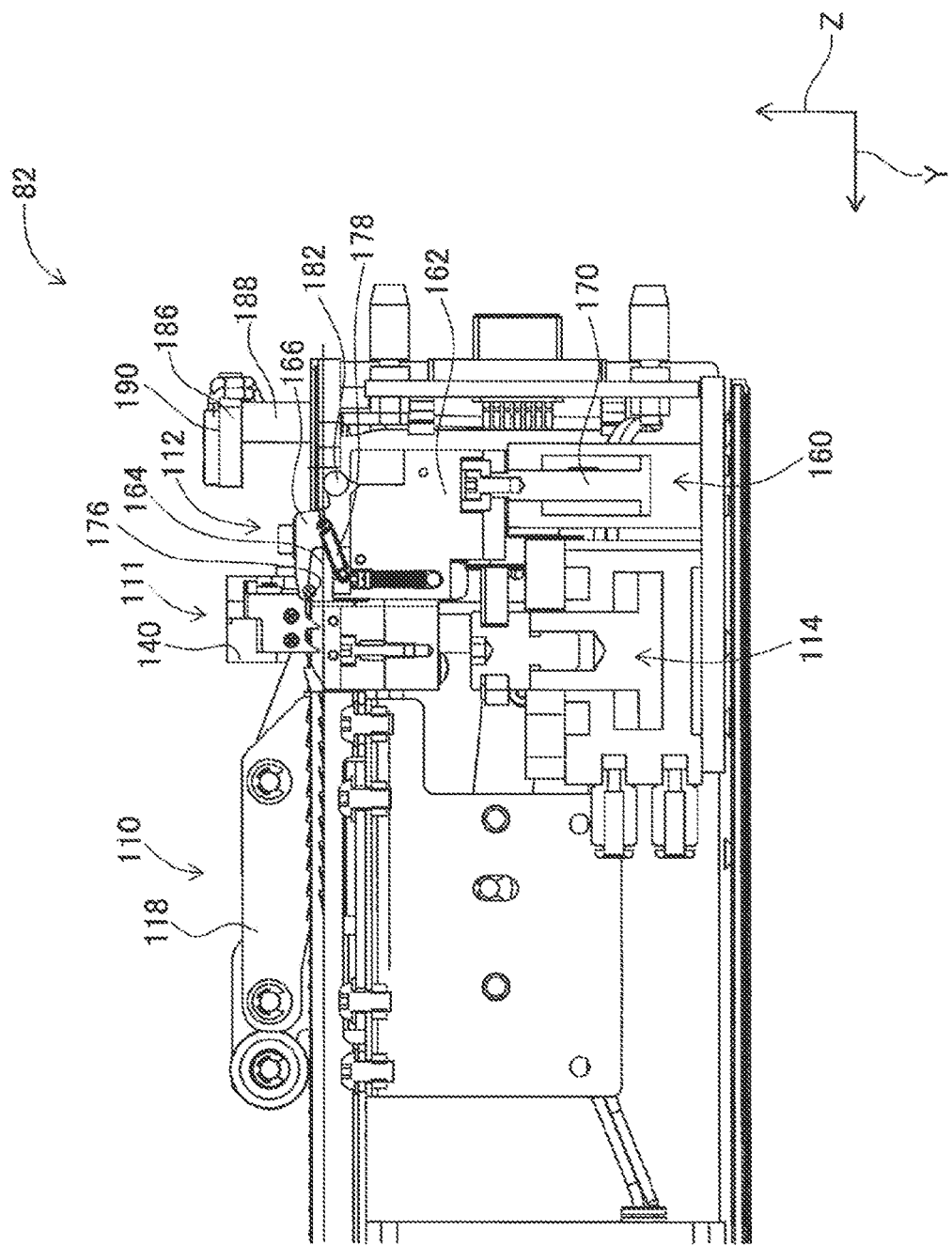
FIG. 9 is an enlarged sectional view of the tape feeder.
Figure 10:
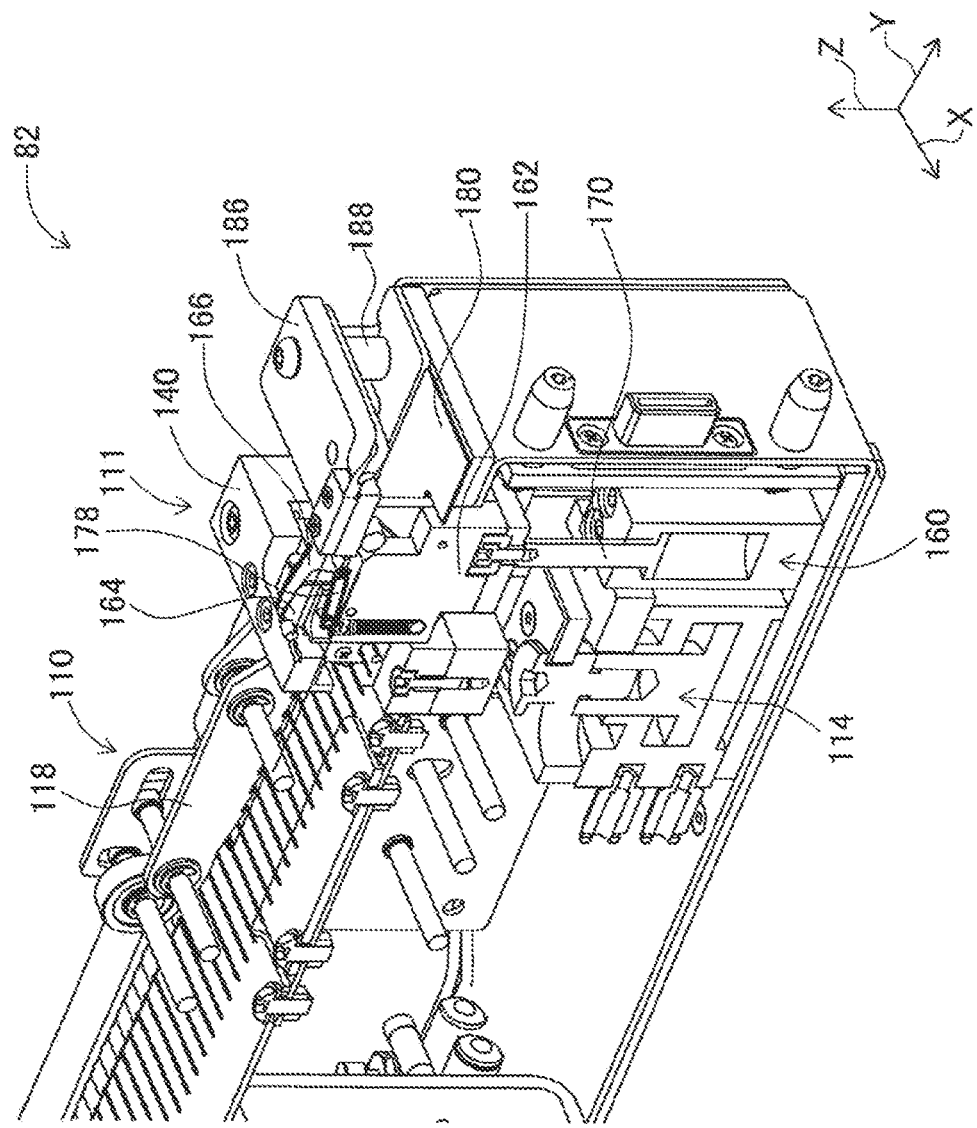
FIG. 10 is an enlarged perspective view of the tape feeder.

As shown in FIGS. 7 to 10, bending device 112 includes piston 160, support block 162, pair of support members 164, pair of clamp arms 166, and pair of bending rollers 168. FIG. 9 is a sectional view taken along line A-A in FIG. 4, and FIG. 10 is a view showing tape feeder 82 as viewed from the front and obliquely downwards of tape feeder 82 shown in FIG. 9. Piston 160 is disposed at a front side of piston 114 of feeding device 110 inside feeder main body 107 in such a manner as to extend generally in the up-down direction. Support block 162 is disposed below axial component 90 which is positioned by stoppers 138 and is held movably in the up-down direction inside the feeder main body 107. Then, support block 162 is coupled to piston rod 170 of piston 160 and is caused to ascend as piston 160 extends and to descend as piston 160 contracts.

Support member 164 has generally a plate-like shape, and V-shaped groove 176 is formed in an upper end edge thereof. Then, pair of support members 164 are disposed in such a manner as to face each other and are fixed to support block 162. Pair of support members 164 are fixed to support block 162 in such a manner that V-shaped grooves 176 thereof are positioned below pair of lead wires 98 of axial component 90 which is positioned by corresponding stoppers 138. Incidentally, a distance defined between lead wire 98 of axial component 90, which are so positioned, and the upper edge of support member 164 is set extremely short. That is, support member 164 is located below lead wire 98 of axial component 90 so positioned with such a small distance defined between lead wire 98 and itself. As a result, as support block 162 ascends, the pair of leads of axial component 90 are supported by pair of support members 164 while being positioned thereby.

Pair of clamp arms 166 each have a generally L-like shape and is held pivotably in the front-rear direction by support block 162 at lower end portions thereof. Pair of clamp arms 166 extend upwards of taped component 88, which extends on the upper surface of feeder main body 107, at front sides of pair support members 164. Then, portions of pair of clamp arms 166, which extend upwards of taped component 88, are bent generally at an angle of 90 degrees to the rear, that is, upwards of pair of support members 164. As a result, distal end portions of pair of clamp arms 166 are located above pair of support members 164 while holding therebetween pair of lead wires 98 on taped component 88, which extends on the upper surface of feeder main body 107.

Figure 11:
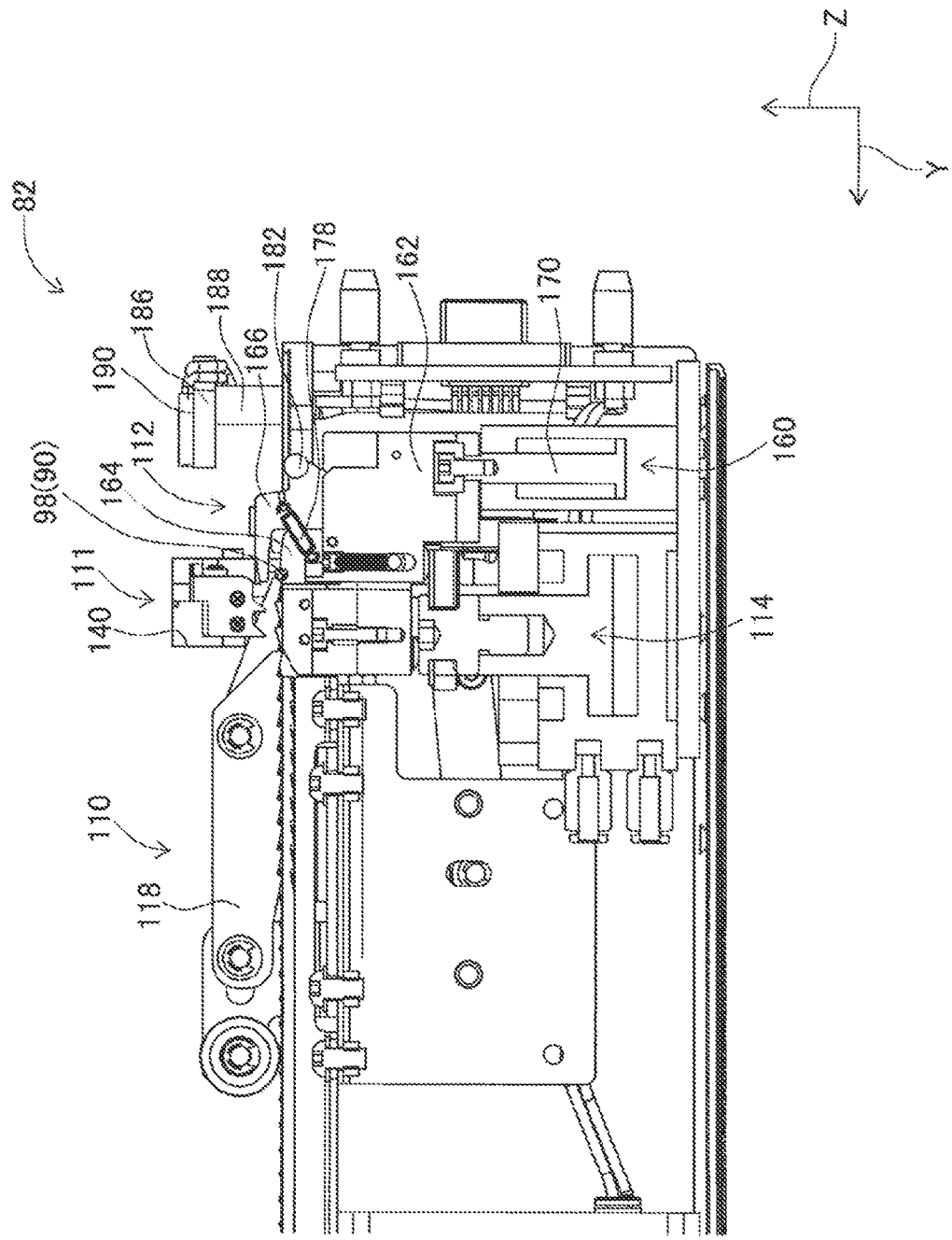
FIG. 11 is the enlarged sectional view of the tape feeder.

Then, clamp arm 166 is biased to the rear by coil spring 178, and as clamp arm 166 swings to the rear, the distal end portion of clamp arm 166 is brought into contact with lead wire 98 above support member 164, as shown in FIG. 9. As shown in FIG. 10, however, push-up plate 180 is disposed below clamp arm 166, and push-up plate 180 is fixed to lifting and lowering block 140 of cutting device 111. As a result, when lifting and lowering block 140 ascends, push-up plate 180 also ascends, whereby clamp arms 166 are pushed up by push-up plate 180. Then, when lifting and lowering block 140 ascends up to an uppermost end, clamp arms 166 are pushed up by push-up plate 180. As a result, as shown in FIG. 11, the distal end portions of clamp arms 166 move away from corresponding lead wires 98. That is, a clearance is generated individually between lead wires 98 of taped component 88, which extends on the upper end face of feeder main body 107, and the distal end portion of corresponding clamp arm 166.

Figure 12:
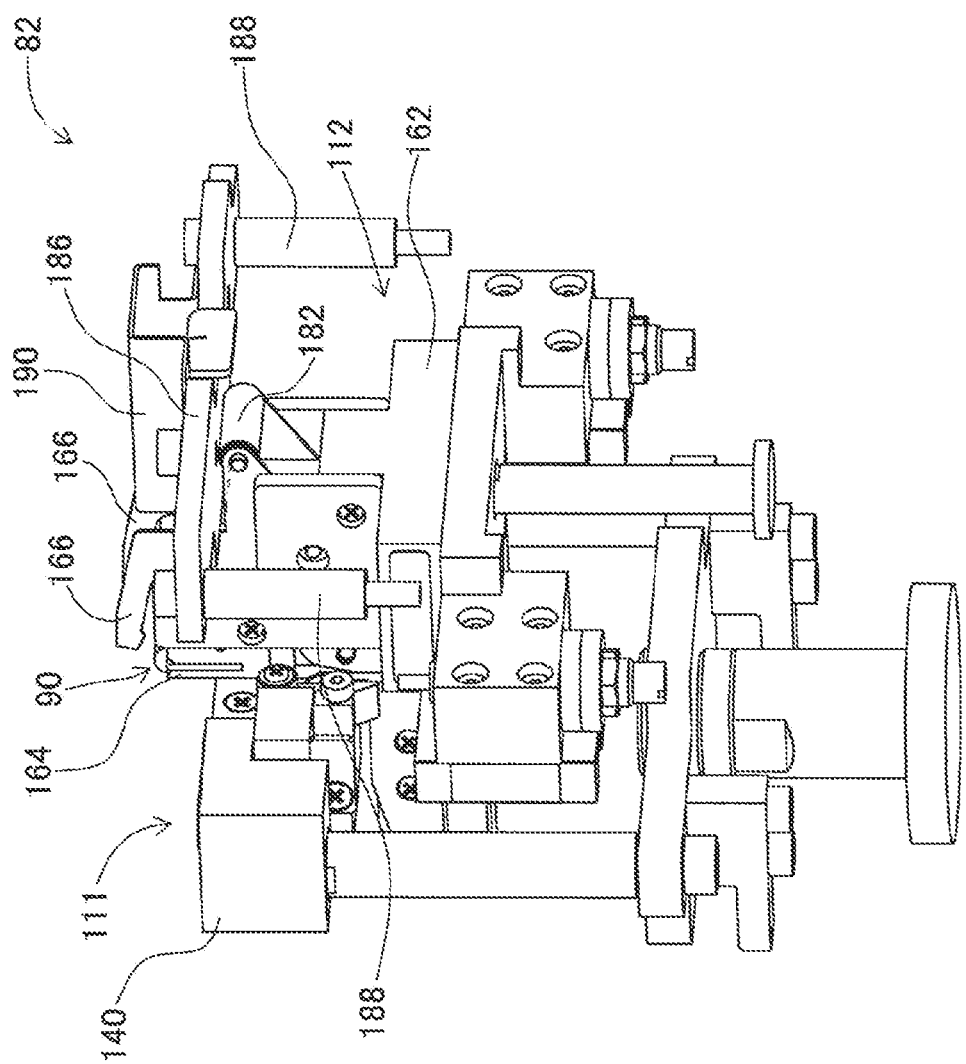
FIG. 12 is an enlarged perspective view of the cutting device and the bending device.
Figure 13:
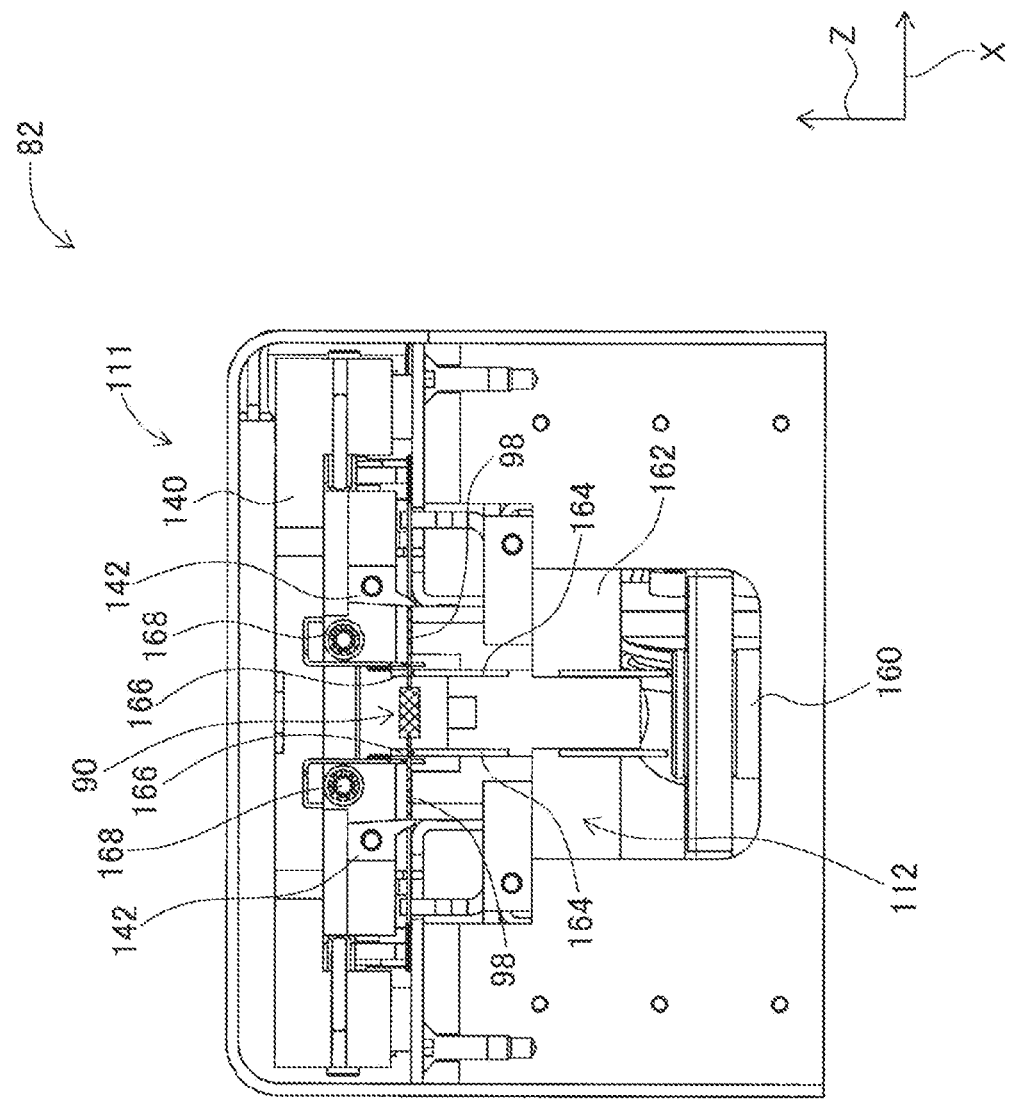
FIG. 13 is the enlarged front view of the tape feeder.

Additionally, as shown in FIG. 12, pair of clamp arms 166 are coupled together at front end portions thereof by coupling roller 182. Then, fixation table 186 is fixed to the upper surface of feeder main body 107 via a pair of support legs 188 above coupling roller 182. Fixation table 186 is not shown in FIG. 7 in order to secure the visibility of clamp arms 166 and the like, and feeder main body 107 is not shown in FIG. 12 in order to secure the visibility of support block 162 and the like. Incidentally, fixation table 186 is disposed ahead of lifting and lowering block 140, and, when viewed from above, pair of clamp arms 166 are located between lifting and lowering block 140 and fixation table 186, and only coupling roller 182, which couples pair of clamp arms 166 together, is located below fixation table 186.

As shown in FIG. 7, pair of bending rollers 168 are disposed on a side surface of lifting and lowering block 140, which is disposed above taped component 88, which extends on the upper end face of feeder main body 107. Pair of bending rollers 168 are configured to rotate on their own axes which extend in the front-rear direction on the side surface of lifting and lowering block 140 and are located above pair of lead wires 98 of axial component 90 which are positioned by corresponding stoppers 138. Pair of bending rollers 168 are disposed at the same height in the up-down direction.

Additionally, as shown in FIG. 12, detection sensor 190 is provided on an upper surface of fixation table 186. Detection sensor 190 is a reflection-type optical sensor and includes a light emitting section and a light receiving section. Then, detection sensor 190 irradiates light from the light emitting section and receives light reflected by a detection target body at the light receiving section when the detection target body exists in a direction in which the light is irradiated. On the other hand, when there is no detection target body in the direction in which the light is irradiated, the light irradiated from the light emitting section is not reflected in any way, whereby the light receiving section receives no light. That is, in the case that the light receiving section receives light irradiated from the light emitting section, a detection target body exists in the direction in which the light is irradiated, whereas in the case that the light receiving section does not receive the light irradiated from the light emitting section, a detection target body does not exist in the direction in which the light is irradiated. With this structure, detection sensor 190 detects the presence or absence of a detection target body in the direction in which light is irradiated by the light emitting section.

Detection sensor 190 irradiates light generally in a horizontal direction to the rear, and although it will be described in detail later, axial component 90, which is supported by pair of support members 164 when support block 162 of bending device 112 ascends, is located in the direction in which the light is irradiated. Then, axial component 90 is supplied in that position. As a result, detection sensor 190 is made to function as a sensor for detecting whether axial component 90 is supplied in the supply position.

In component mounter 10, with the configuration that has been described heretofore, a component mounting operation is executed on circuit base material 12 held by base material conveyance and holding device 22. Specifically speaking, circuit base material 12 is conveyed to a work position and is held fixedly by clamp device 52 in the work position. Next, imaging device 26 moves to a position above circuit base material 12 to image circuit base material 12. As a result, information is obtained which relates to positions of pair of through holes (not shown) which are formed in circuit base material 12. In addition, bulk component supply device 30 or component supply device 32 supplies components in a predetermined supply position. Hereinafter, supplying components by use of feeder-type component supply device 80 of component supply device 32 will be described in detail.

In feeder-type component supply device 80, at tape feeder 82, taped component 88, which extends on the upper end face of feeder main body 107, is fed out towards the component supply position as piston 114 of feeding device 110 operates. That is, as described above, when the upper end of second arm 124 moves to the front as piston 114 extends, feed arm 118 also moves to the front, whereby taped component 88 is fed out towards the component supply position located at the front side of tape feeder 82. Then, when taped component 88 is fed out to the front, lead wires 98 of axial component 90 are brought into abutment with corresponding stoppers 138, whereby lead wires 98 of axial component 90 are positioned.

As piston 114 extends, lifting and lowering block 140 of cutting device 111 ascends. That is, lifting and lowering block 140 ascends when taped component 88 is pushed up to the front. At this time, when lifting and lowering block 140 ascends, since clamp arms 166 are pushed up by push-up plate 180 as described above, the distal end portions of clamps 166 move away from corresponding lead wires 98 as shown in FIG. 11. As a result, taped component 88 is suitably fed out to the front without being interrupted by clamp arms 166, and lead wires 98 of axial component 90 are then brought into abutment with corresponding stoppers 138, whereby lead wires 98 of axial component 90 are positioned.

Then, in such a state that lead wires 98 of axial component 90 are positioned by corresponding stoppers 138, grooves 176 of support members 164 are located below lead wires 98 so positioned, while clamp arms 166 are located above corresponding lead wires 98. In addition, when lead wires 98 of axial component 90 are positioned by corresponding stoppers 138, piston 114 stops extending and starts contracting. As this occurs, lifting and lowering block 140 descends to thereby release push-up plate 180 from pushing up clamp arms 166, whereby clamp arms 166 are caused to swing to the rear, that is, towards lead wires 98 of axial component 90 which are so positioned by means of the elastic force of coil spring 178. This causes lead wires 98 of axial component 90 which are so positioned to be pressed downwards from above by clamp arms 166. As a result, lead wires 98 are pressed down towards corresponding grooves 176 formed on support members 164 located below lead wires 98 by corresponding clamp arms 166, whereby lead wires 98 are clamped inside grooves 176 by support members 164 and clamp arms 166, as shown in FIG. 9.

In addition, in such a state that lead wires 98 of axial component 90 which are so positioned are clamped by support members 164 and clamp arms 166, as piston 114 contracts further, lifting and lowering block 140 descends further. As this occurs, cutters 142, which are fixed to lifting and lowering block 140, descend together with lifting and lowering block 140, whereby lead wires 98 of axial component 90 which are positioned by corresponding stoppers 138 are cut by corresponding cutters 142, as shown in FIG.

13. As a result, axial component 90 is separated from carrier tapes 92. Since lead wires 98 are clamped by support members 164 and clamp arms 166, lead wires 98 are suitably cut by corresponding cutters 142.

Additionally, since the upper end of second arm 124 is caused to move to the rear by link mechanism 116 when piston 114 contracts, feed arm 118 moves to the rear. At this time, since lead wires 98 of axial member 90, which are taped to taped component 88, are brought into engagement with teeth 136 of reversal prevention arm 120, taped component 88 is prevented from moving to the rear. As a result, as piston 114 contracts, feed arm 118 is returned to the rear without causing taped component 88 to move to the rear.

Figure 14:
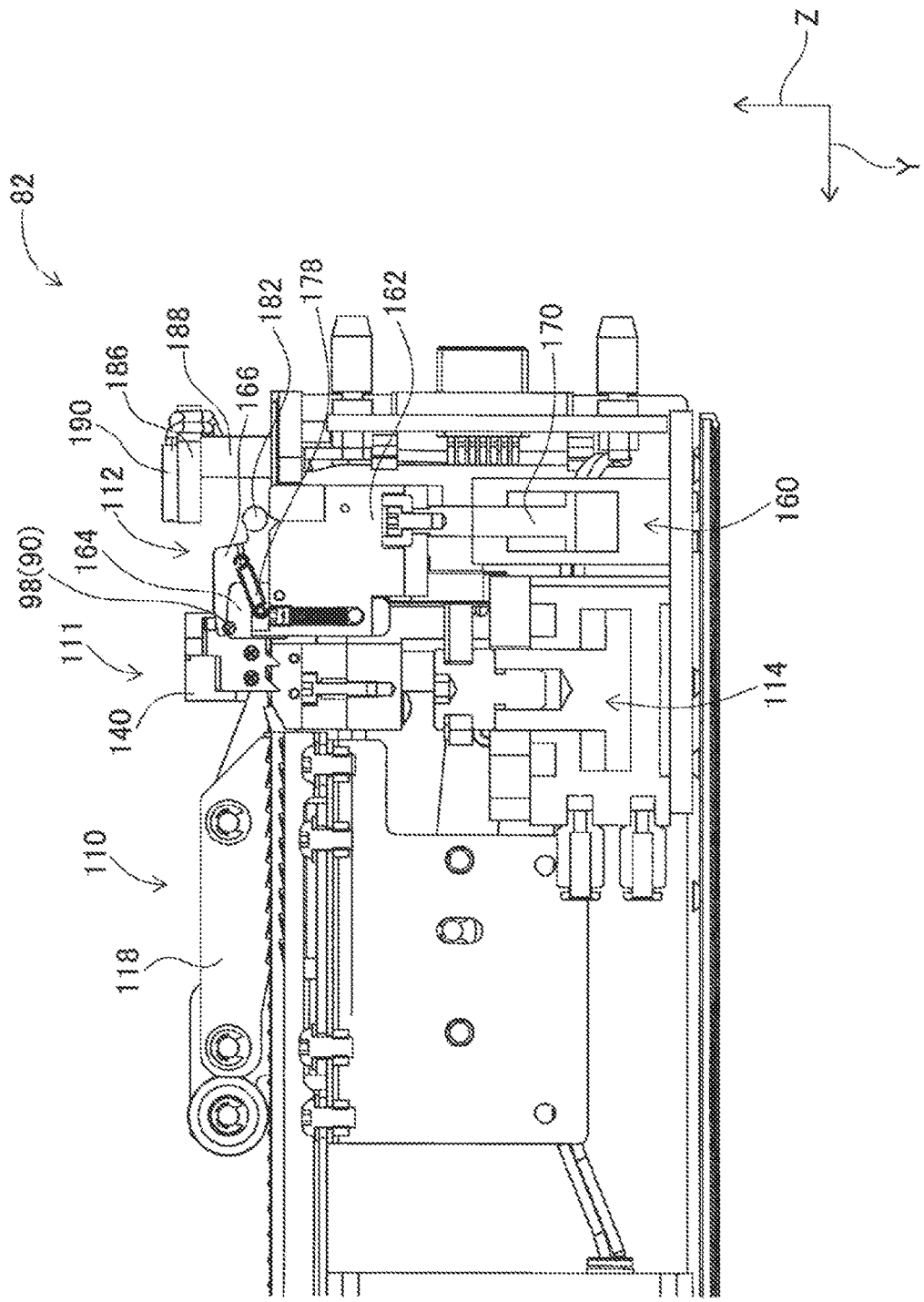
FIG. 14 is the enlarged sectional view of the tape feeder.
Figure 15:
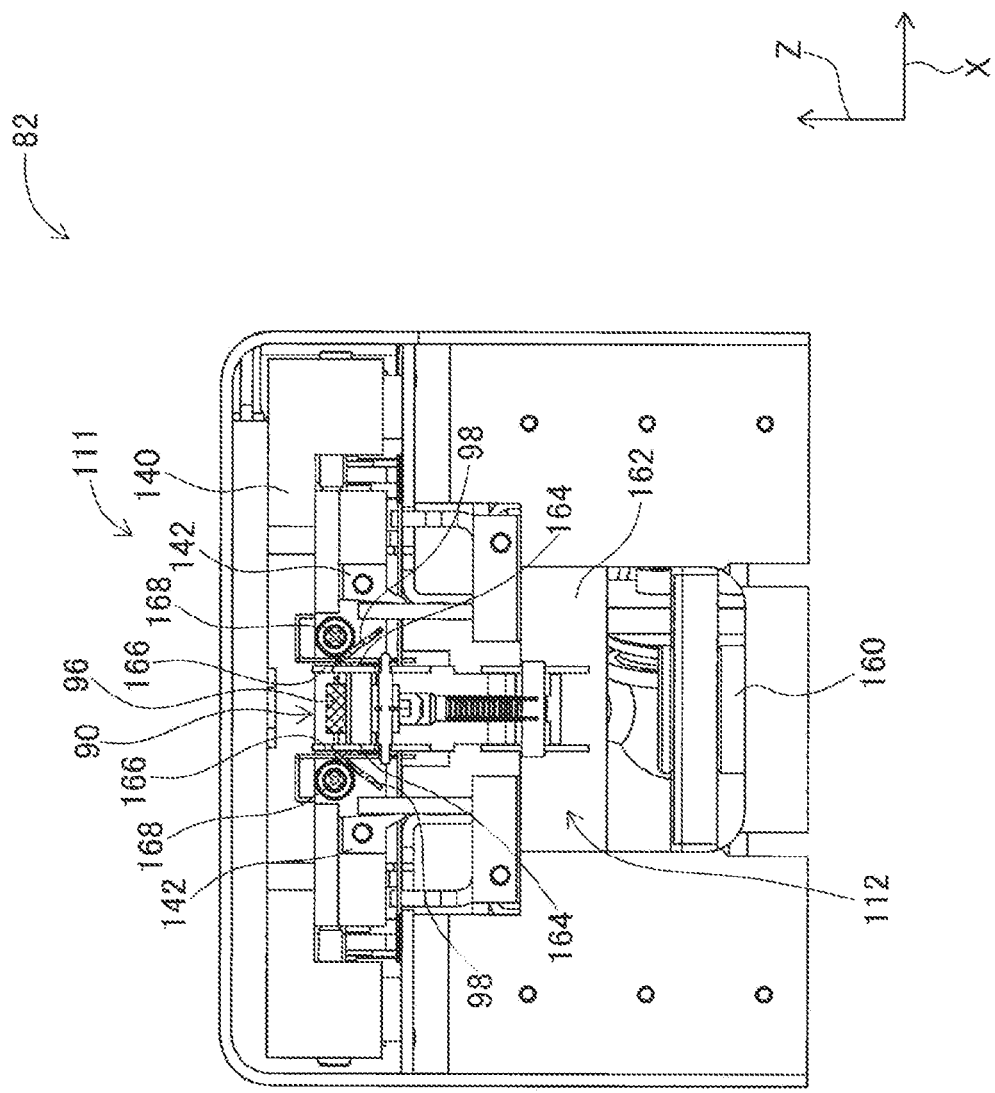
FIG. 15 is an enlarged front view of the tape feeder.
Figure 16:
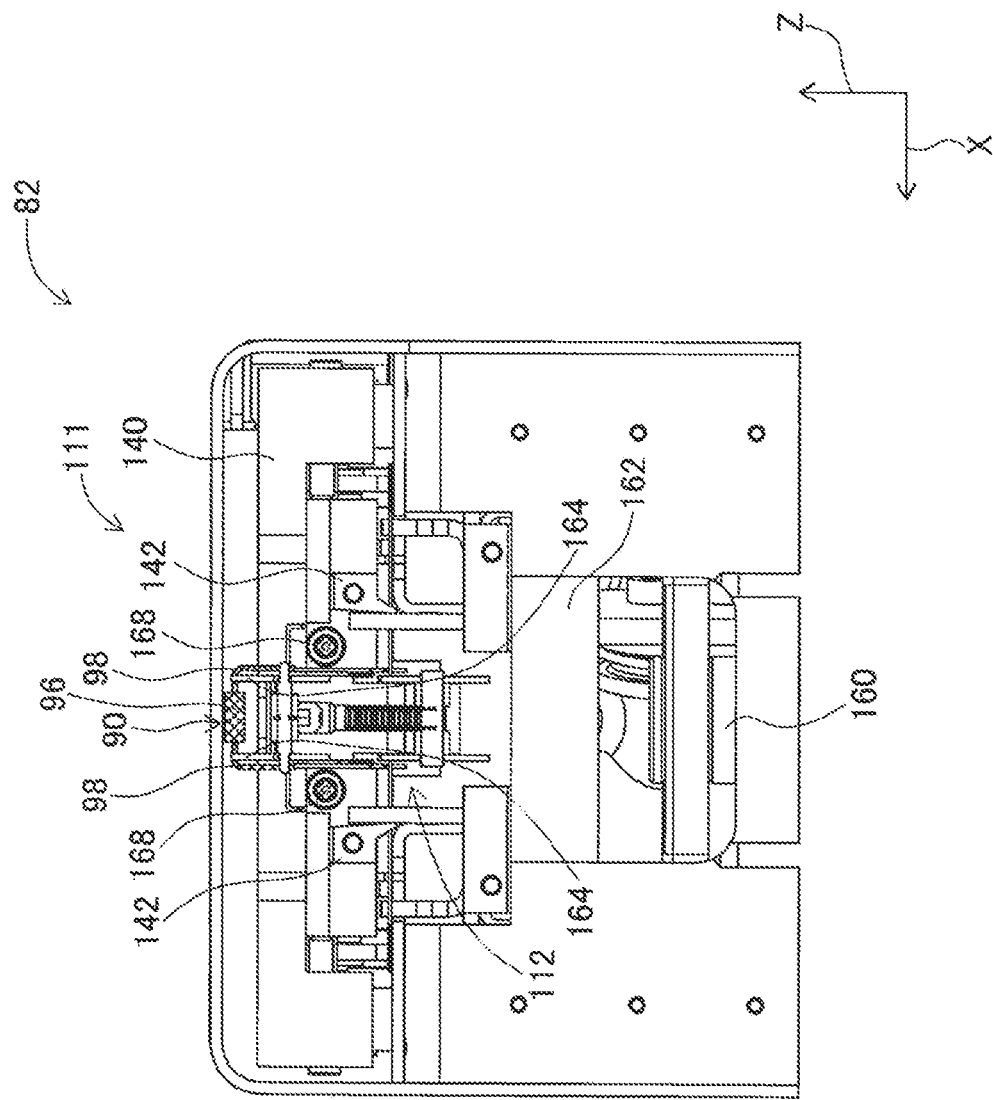
FIG. 16 is the enlarged front view of the tape feeder.

When lead wires 98 are cut off, allowing axial component 90 to be separated from carrier tapes 92 in the way described above, piston 160 of bending device 112 extends, and support block 162 ascends, whereby axial component 90, which is being positioned and clamped by support members 164 and clamp arms 166, ascends as shown in FIG. 14. As this occurs, pair of lead wires 98 of axial component 90 are brought into abutment with pair of bending rollers 168, which are provided on the side surface of lifting and lowering block 140. Then, as piston 160 extends, that is, support block 162 ascends, pair of lead wires 98, which are now in abutment with pair of corresponding bending rollers 168, are bent downwards by pair of corresponding bending rollers 168 as shown in FIG. 15. At this time, when piston 160 further extends, and support block 162 further ascends, lead wires 98 are bent in a direction at right angles to an axial center of component main body 96, as shown in FIG. 16. Since lead wires 98 are clamped by support members 164 and clamp arms 166, lead wires 98 are suitably bent by corresponding bending rollers 168.

Figure 17:
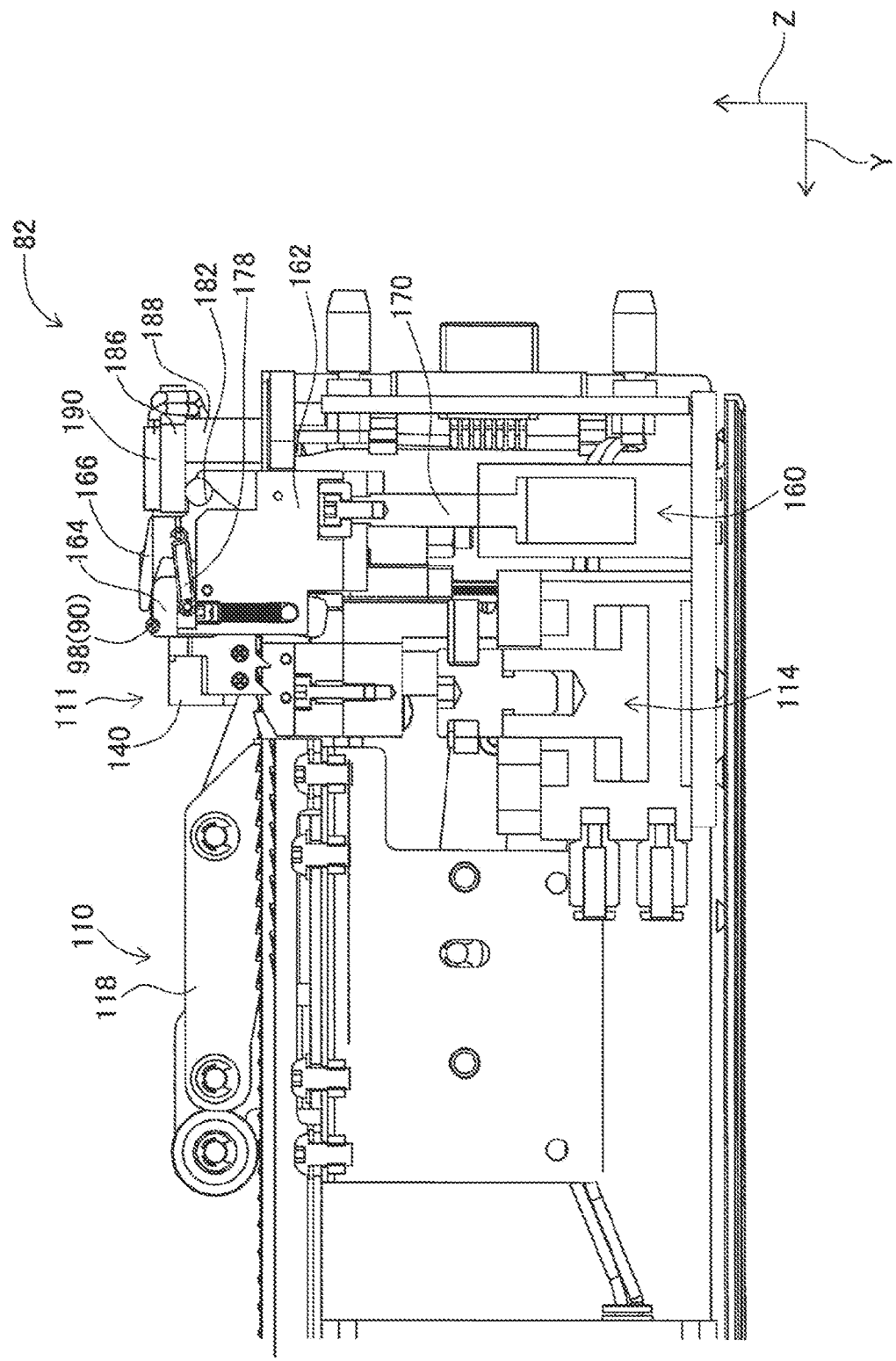
FIG. 17 is the enlarged sectional view of the tape feeder.
Figure 18:
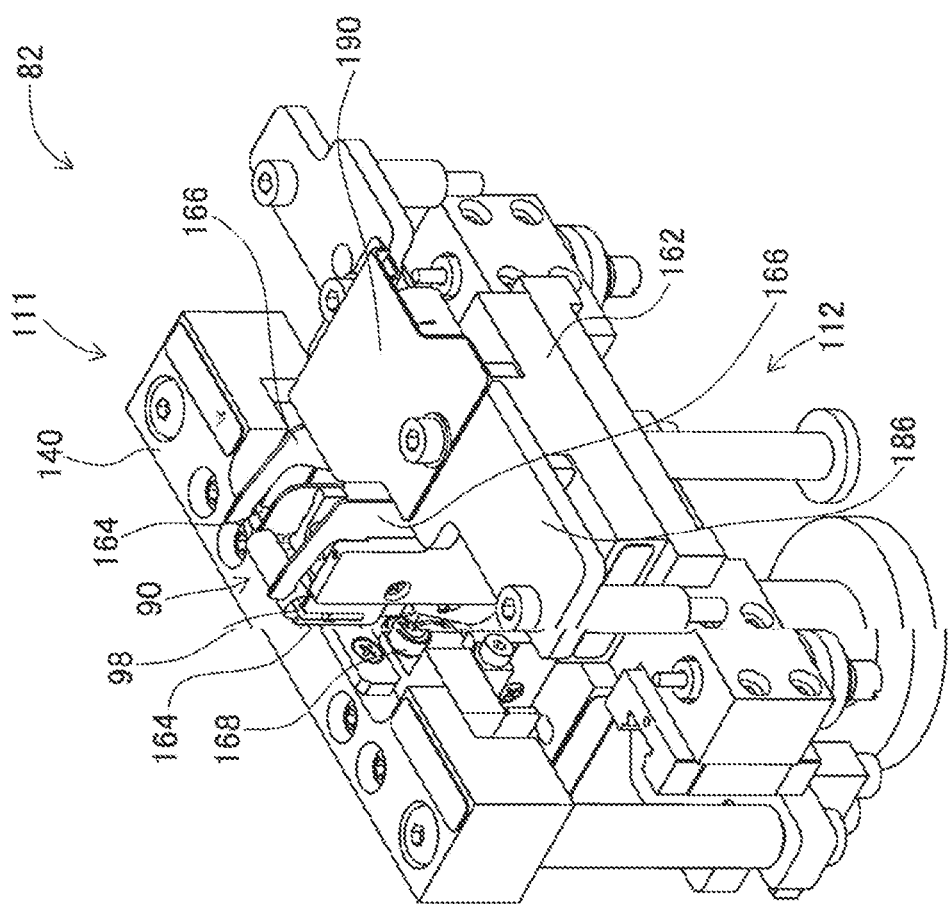
FIG. 18 is an enlarged perspective view of the cutting device and the bending device.

Even after lead wires 98 have been so bent by bending rollers 168, axial component 90 ascends together with support block 162 in such a state that lead wires 98 remaining attached to the component main body, which are not bent, are kept clamped by support members 164 and clamp arms 166. At this time, coupling roller 182, which is disposed at front ends of clamp arms 166, is brought into abutment with a lower surface of fixation table 186, as shown in FIG. 17. This causes clamp arms 166 to swing in a direction in which clamp arms 166 move away from lead wires 98 that clamp arms 166 have clamped until then, that is, to the front, as shown in FIG. 18. As a result, the clamping of pair of lead wires 98 by support members 164 and clamp arms 166 is released. That is, axial component 90 results in such a state that axial component 90 is detachably positioned and is supported from below only by pair of support members 164.

In addition, when support block 162 ascends until coupling roller 182 is brought into abutment with fixation table 186 and the clamping of lead wires 98 by clamp arms 166 is released, piston 160 extends to its maximum extent, and axial component 90, which is now supported by support members 164, is lifted up to a highest position. Then, axial component 90 is supplied in this position in such a state that the clamping of lead wires 98 by clamp arms 166 is released. That is, when piston 160 extends to its maximum extent, and support block 162 ascends to its highest extent, the position of axial component 90, which is now supported by support members 164, coincides with the component supply position of tape feeder 82. As described above, in tape feeder 82, the clamping of lead wires 98 by clamp arms 166 is released after lead wires 98, which are clamped by support members 164 and clamp arms 166, are cut and bent. Then, axial component 90 is supplied in the component supply position while being supported by support members 164.

Detection sensor 190, which is disposed on the upper surface of fixation table 186, is disposed at the same height as the supply position of axial component 90 and irradiates light towards the supply position of axial component 90. This enables detection sensor 190 to detect whether axial component 90 is supplied in the supply position. As a result, a supply timing at which axial component 90 is supplied by tape feeder 82 and whether axial component 90 is supplied as required can be recognized suitably. Then, when detection sensor 190 detects a supply of axial component 90, either of work heads 60, 62 is caused to move to the position above that axial component 90, and axial component 90 is held by suction nozzle 66 at component main body 96 thereof.

Subsequently, work heads 60, 62, which individually hold axial components 90, move to a position above imaging device 28, whereby axial components 90 held by corresponding suction nozzles 66 are imaged by imaging device 28. As a result, information on an error of component holding position can be obtained. Subsequently, work heads 60, 62, which individually hold axial components 90, move to a position above circuit base material 12 and adjust the positions and orientations of the components that work heads 60, 62 hold based on the positions of through holes formed in circuit base material 12, the component holding positions, and the like. At this time, the movements and component holding orientations of work heads 60, 62 are adjusted so that a pair of through holes formed in circuit base material 12 coincide with distal ends of pair of lead wires 98 of axial components 90 held by suction nozzles 66 in the up-down direction. Then, work heads 60, 62 descend so as to insert pairs of lead wires 98 of axial components 90 that suction nozzles 66 hold into pairs of through holes which are formed in circuit base material 12. As a result, axial components 90 are mounted on circuit base material 12. In this manner, pair of lead wires 98 are bent in the same direction in tape feeder 82 so that the pair of lead wires 98 are inserted into a corresponding pair of through holes in circuit base material 12.

With tape feeder 82, as described above, as piston 114 operates, feed arm 118 is caused to move to the front, taped component 88 is fed out to the front, and lifting and lowering block 140 descends, whereby lead wires 98 are cut by cutters 142. That is, with tape feeder 82, feeding device 110 and cutting device 111 are driven by one actuator. In other words, one actuator is shared or made commonable for use as an actuator for feeding out taped component 88 and an actuator for cutting lead wires 98. As a result, the number of actuators to be provided can be reduced, thereby making it possible not only to reduce costs involved but also to save space for installation of actuators. In addition, since feeding device 110 and cutting device 111 are allowed to operate by one piston 114, a reduction in development costs can be realized by simplifying the control of piston 114 and a control program therefor. Moreover, when compared with a case in which feeding device 110 and cutting device 111 are individually operated by separate pistons, a consumption amount of air can also be reduced, thereby making it possible to protect the environment.

Additionally, with tape feeder 82, as described above, as support block 162 ascends, lead wires 98, which are now clamped by support members 164 and clamp arms 166, are bent by bending rollers 168, whereafter coupling roller 182 is brought into abutment with fixation table 186, whereby these lead wires 98 are released from the clamped condition. That is, support block 162 ascends as piston 160 of bending device 112 extends, whereby the clamped lead wires are bent and are then released from the clamped condition. As described above, with tape feeder 82, the lead wires are released from the clamped condition by making use of the operation of piston 160, which drives bending device 112. That is, bending device 112 and the mechanism for releasing lead wires 98 from the clamped condition are driven by one actuator. In other words, one actuator is shared or made commonable for use as an actuator for bending lead wires 98 and an actuator for releasing lead wires 98 from the clamped condition. As a result, the number of actuators to be provided can be reduced, thereby making it possible not only to reduce costs involved but also to save space for installation of actuators. In addition, since the lead wires can be bent and released from the clamped condition through the operation of single piston 160, a reduction in development costs can be realized by simplifying the control of piston 160 and a control program therefor. Moreover, when compared with a case in which the lead wires are bent and released from the clamped condition through operations of separate pistons, a consumption amount of air can also be reduced, thereby making it possible to protect the environment.

Tape feeder 82 constitutes an example of the tape feeder. Taped component 88 constitutes an example of the taped electric component. Axial component 90 constitutes an example of the electric component, a lead component, and an axial lead component. Carrier tape 92 constitutes an example of the carrier tape. Feeding device 110 constitutes an example of a feeding device. Cutting device 111 constitutes an example of a cutting device. Bending device 112 constitutes an example of a bending device. Piston 114 constitutes an example of an actuator. Piston 160 constitutes an example of the actuator. Clamp arm 166 constitutes an example of a clamp device. Detection sensor 190 constitutes an example of the detection sensor.

In addition, the present disclosure is not limited to the embodiment that has been described heretofore and hence can be carried out in various aspects in which various modifications and improvements are made based on the knowledge of those skilled in the art to which the present disclosure pertains. For example, in the embodiment described above, the position where axial component 90 is lifted up by support members 164 after it has been cut off from taped component 88 is described as the component supply position; however, the position where axial component 90 is cut off from taped component 88 may be referred to as the component supply position. In addition, a position situated at a front side of the position where axial component 90 is cut off from taped component 88 may be referred to as the component supply position.

In the embodiment described above, the reflection-type optical sensor is adopted as detection sensor 190; however, a transmission-type optical sensor may be adopted as detection sensor 190. In addition, the detection sensor is not limited to such optical sensors, and hence, sensors of various types can be adopted as long as they can detect the presence or absence of a component. For example, a configuration may be adopted in which a pressure sensor is provided on suction nozzle 66 for holding a component, so that whether a component is held by suction nozzle 66 is detected based on a detection value of the pressure sensor to thereby detect the presence or absence of the component in the supply position. Further, for example, another configuration may be adopted in which a component is held by a gripping tool or a chuck, in which case, whether a component is held by the chuck is detected based on a gripping angle or a gripping force of a gripping claw to thereby detect the presence or absence of the component in the supply position. Furthermore, for example, a further configuration may be adopted in which a contact-type sensor such as a lever-type or switch-type sensor or the like may be disposed at the component supply position to thereby detect the presence or absence of a component based on whether the component is in mechanical contact with the contact-type sensor.

In the embodiment described above, the presence or absence of a component is detected by detection sensor 190 before axial components 90 are supplied to work heads 60, 62 in the supply position; however, the presence or absence of a component may be detected when components are supplied to work heads 60, 62, that is, in the midst of execution of the component holding operations by work heads 60, 62, or the presence or absence of a component may be detected after components have been supplied to work heads 60, 62, that is, after work heads 60, 62 have executed the component holding operations. Further, the presence or absence of a component may be detected not only in the component supply position but also upstream of the component supply position. That is, a configuration may be adopted in which the presence or absence of a component is detected upstream of the component supply position, whereafter the component whose presence is detected is then fed out to the component supply position. For example, a lead component may be detected before it is cut off from carrier tapes 92.

In addition, the present disclosure is applied to the tape feeder for supplying axial components 90; however, the present disclosure may be applied to a tape feeder for supplying radial components. Further, the present disclosure may be applied to a tape feeder for supplying not lead components but electric components without lead wires, for example, square chips or the like.

In the embodiment described above, axial component 90 is described as being held by suction nozzle 66 at component main body 96 thereof; however, axial component 90 may be gripped at component main body 96 or lead wires 98 by a chuck That is, when the lead component is held by a component holding tool such as a suction nozzle or a chuck, the lead component needs only to be held by such a component holding tool at, at least, either of the component main body and the lead wires thereof.

Axial component 90 is described as being clamped at lead wires 98 by clamp arms 166; however, axial component 98 may be clamped at component main body 96 by clamp arms 166. That is, when the lead wires of the lead component are cut, the lead component needs only to be clamped at, at least, either of the component main body and the lead wires.

In the embodiment described above, lead wires 98 are cut off in such a state that lead wires 98 are clamped by clamp arms 166, and axial component 90, from which lead wires 98 are cut off now, is lifted up to the supply position in such a state that the clamping is maintained; however, the clamping by clamp arms 166 may be released once after lead wires 98 are cut off. Then, axial component 90, which is now released from the clamped condition, may be caused to move to the supply position. That is, as long as axial component 90 is clamped in the cutting position and axial component 90 is released from the clamped condition in the supply position, axial component 90 may be clamped or may not be clamped in any position between the cutting position and the supply position.

In the embodiment described above, axial component 90 is described as being supplied in the position where axial component 90 is lifted up after lead wires 98 have been bent by bending device 112; however, axial component 90 may be supplied in the position where lead wires 98 are bent by bending device 112. In addition, axial component 90 may be supplied in a position where axial component 90 moves to the front after lead wires 98 have been bent.

REFERENCE SIGNS LIST

82: Tape feeder, 88: taped component (taped electric component), 90: axial component (electric component) (axial lead component), 110: feeding device, 111: cutting device, 112: bending device, 114: piston (actuator), 160: piston (actuator), 166: clamp arm (clamp device), 190: detection sensor

The invention claimed is:

1. A tape feeder for supplying an electric component held on a carrier tape in a supply position, the tape feeder comprising:
    a cutting device configured to cut off the electric component from the carrier tape, the cutting device including a lifting and lowering block, and a pair of cutters detachably fixed to the lifting and lowering block:
    a clamp device configured to clamp the electric component, the clamp device including a pair of clamp arms coupled together by a coupling roller;
    a bending device configured to bend a lead of the electric component in order to supply the electric component with the lead that is bent in the supply position, the bending device including a support block and a pair of bending rollers disposed on a side surface of the lifting and lowering block; and
    a detection sensor configured to detect presence or absence of the electric component in the supply position,
    wherein the detection sensor is disposed on an upper surface of a fixation table, and
    wherein in a maximum upper position of the support block, the coupling roller abuts a lower surface of the fixation table.

2. The tape feeder according to claim 1, further comprising:
    a feeding device configured to feed the carrier tape so as to feed the electric component to the supply position,
    wherein the cutting device and the feeding device are driven by a first actuator.

3. The tape feeder according to claim 1,
    wherein the electric component is supplied in the supply position in such a state that clamping of the electric component by the clamp device is released.

4. The tape feeder according to claim 3,
    wherein clamping of the electric component by the clamp device is released using a second actuator for driving the bending device.

5. The tape feeder according to claim 1, wherein the fixation table is fixed to an upper surface of a main body of the tape feeder via a pair of support legs above the coupling roller.

* * * * *